United States Patent
Jin et al.

(10) Patent No.: US 7,421,032 B2
(45) Date of Patent: Sep. 2, 2008

(54) SERIAL CONCATENATION OF INTERLEAVED CONVOLUTIONAL CODES FORMING TURBO-LIKE CODES

(75) Inventors: Hui Jin, Glen Gardner, NJ (US); Aamod Khandekar, Pasadena, CA (US); Robert J. McEliece, Pasadena, CA (US)

(73) Assignee: Callifornia Institute of Technology, Pasadena, CA (US)

( * ) Notice: Subject to any disclaimer, the term of this patent is extended or adjusted under 35 U.S.C. 154(b) by 0 days.

(21) Appl. No.: 11/542,950

(22) Filed: Oct. 3, 2006

(65) Prior Publication Data

US 2007/0025450 A1    Feb. 1, 2007

Related U.S. Application Data

(63) Continuation of application No. 09/861,102, filed on May 18, 2001, now Pat. No. 7,116,710, and a continuation-in-part of application No. 09/922,852, filed on Aug. 18, 2000, now Pat. No. 7,089,477.

(60) Provisional application No. 60/205,095, filed on May 18, 2000.

(51) Int. Cl.
    *H04L 5/12* (2006.01)
(52) U.S. Cl. .................. 375/262; 375/265; 375/348; 714/755; 714/786; 714/792; 341/52; 341/102
(58) Field of Classification Search .......... 375/259, 375/262, 265, 285, 296, 341, 346, 348; 714/746, 714/752, 755, 756, 786, 792, 794–796; 341/51, 341/52, 56, 102, 103
See application file for complete search history.

(56) References Cited

U.S. PATENT DOCUMENTS

| | | | |
|---|---|---|---|
| 5,392,299 A | | 2/1995 | Rhines et al. |
| 5,530,707 A | * | 6/1996 | Lin ............................. 714/792 |
| 5,751,739 A | | 5/1998 | Seshadri et al. |
| 5,802,115 A | * | 9/1998 | Meyer ........................ 375/341 |
| 5,881,093 A | | 3/1999 | Wang et al. |
| 6,014,411 A | | 1/2000 | Wang |
| 6,023,783 A | | 2/2000 | Divsalar et al. |
| 6,031,874 A | | 2/2000 | Chennakeshu et al. |
| 6,032,284 A | | 2/2000 | Bliss |
| 6,044,116 A | | 3/2000 | Wang |
| 6,094,739 A | * | 7/2000 | Miller et al. ................. 714/792 |

(Continued)

OTHER PUBLICATIONS

Appendix A.1 "Structure of Parity Check Matrices of Standardized LDPC Codes," Digital Video Broadcasting (DVB) User guidelines for the second generation system for Broadcasting, Interactive Services, News Gathering and other broadband satellite applications (DVB-S2) ETSI TR 102 376 V1.1.1. (Feb. 2005) Technical Report, pp. 64.

(Continued)

*Primary Examiner*—Dac V. Ha
(74) *Attorney, Agent, or Firm*—Fish & Richardson P.C.

(57) ABSTRACT

A serial concatenated coder includes an outer coder and an inner coder. The outer coder irregularly repeats bits in a data block according to a degree profile and scrambles the repeated bits. The scrambled and repeated bits are input to an inner coder, which has a rate substantially close to one.

23 Claims, 5 Drawing Sheets

U.S. PATENT DOCUMENTS

| | | | |
|---|---|---|---|
| 6,396,423 | B1 | 5/2002 | Laumen et al. |
| 6,437,714 | B1 | 8/2002 | Kim et al. |
| 6,859,906 | B2 * | 2/2005 | Hammons et al. ........... 714/786 |
| 2001/0025358 | A1 | 9/2001 | Eidson et al. |

OTHER PUBLICATIONS

Benedetto et al., "A Soft-Input Soft-Output Maximum A Posteriori (MAP) Module to Decode Parallel and Serial Concatenated Codes," The Telecommunications and Data Acquisition (TDA) Progress Report 42-127 for NASA and California Institute of Technology Jet Propulsion Laboratory, Jospeh H. Yuen, Ed., pp. 1-20 (Nov. 15, 1996).

Benedetto et al., "Bandwidth efficient parallel concatenated coding schemes," Electronics Letters 31(24): 2067-2069 (Nov. 23, 1995).

Benedetto et al., "Design of Serially Concatenated Interleaved Codes," ICC 97, Montreal, Canada, pp. 710-714, ( Jun. 1997).

Benedetto et al., "Parallel Concatenated Trellis Coded Modulation," ICC '96, IEEE, pp. 974-978, (Jun. 1996).

Benedetto et al., "Serial Concatenated Trellis Coded Modulation with Iterative Decoding," Proceedings from the IEEE 1997 International Symposium on Information Theory (ISIT), Ulm, Germany, p. 8, Jun. 29-Jul. 4, 1997.

Benedetto et al., "Serial Concatenation of Interleaved Codes: Performance Analysis, Design, and Iterative Decoding," The Telecommunications and Data Acquisition (TDA) Progress Report 42-126 for NASA and California Institute of Technology Jet Propulsion Laboratory, Jospeh H. Yuen, Ed., pp. 1-26 (Aug. 15, 1996).

Benedetto et al., "Serial Concatenation of interleaved codes: performance analysis, design, and iterative decoding," Proceedings from the IEEE 1997 International Symposium on Information Theory (ISIT), Ulm, Germany, p. 106, Jun. 29-Jul. 4, 1997.

Benedetto et al., "Soft-output decoding algorithms in iterative decoding of turbo codes," The Telecommunications and Data Acquisition (TDA) Progress Report 42-124 for NASA and California Institute of Technology Jet Propulsion Laboratory, Jospeh H. Yuen, Ed., pp. 63-87 (Feb. 15, 1996).

Benedetto, S. et al., "A Soft-Input Soft-Output APP Module for Iterative Decoding of Concatenated Codes," IEEE Communications Letters 1(1): 22-24 (Jan. 1997).

Berrou et al., "Near Shannon Limit Error-Correcting Coding and Decoding: Turbo Codes," ICC pp. 1064-1070 (1993).

Digital Video Broadcasting (DVB) User guidelines for the second generation system for Broadcasting, Interactive Services, News Gathering and other broadband satellite applications (DVB-S2) ETSI TR 102 376 V 1.1.1. (Feb. 2005) Technical Report, pp. 1-104 (Feb. 15, 2005).

Divsalar et al., "Coding Theorems for 'Turbo-Like' Codes," Proceedings of the 36th Annual Allerton Conference on Communication, Control, and Computing, Sep. 23-25, 1998, Allerton House, Monticello, Illinois, pp. 201-210 (1998).

Divsalar et al., "Effective free distance of turbo codes," Electronics Letters 32(5): 445-446 (Feb. 29, 1996).

Divsalar, D. et al., "Hybrid Concatenated Codes and Iterative Decoding," Proceedings from the IEEE 1997 International Symposium on Information Theory (ISIT), Ulm, Germany, p. 10 (Jun. 29-Jul. 4, 1997).

Divsalar, D. et al., "Low-rate turbo codes for Deep Space Communications," Proceedings from the 1995 IEEE International Symposium on Information Theory, Sep. 17-22, 1995, Whistler, British Columbia, Canada, pp. 35.

Divsalar, D. et al., "Multiple Turbo Codes for Deep-Space Communications," The Telecommunications and Data Acquisition (TDA) Progress Report 42-121 for NASA and California Institute of Technology Jet Propulsion Laboratory, Jospeh H. Yuen, Ed., pp. 60-77 (May 15, 1995).

Divsalar, D. et al., "Multiple Turbo Codes," MILCOM 95, San Diego, CA pp. 279-285 (Nov. 5-6, 1995).

Divsalar, D. et al., "On the Design of Turbo Codes," The Telecommunications and Data Acquisition (TDA) Progress Report 42-123 for NASA and California Institute of Technology Jet Propulsion Laboratory, Jospeh H. Yuen, Ed., pp. 99-131 (Nov. 15, 1995).

Divsalar, D. et al., "Serial Turbo Trellis Coded Modulation with Rate-1 Inner Code," Proceedings from the IEEE 2000 International Symposium on Information Theory (ISIT), Italy, pp. 1-14 (Jun. 2000).

Divsalar, D. et al., "Turbo Codes for PCS Applications," ICC 95, IEEE, Seattle, WA, pp. 54-59 (Jun. 1995).

Jin et al., "Irregular Repeat—Accumulate Codes," 2nd International Symposium on Turbo Codes & Related Topics, Sep. 4-7, 2000, Brest, France, 25 slides, (presented on Sep. 4, 2000).

Jin et al., "Irregular Repeat—Accumulate Codes," 2nd International Symposium on Turbo Codes & Related Topics, Sep. 4-7, 2000, Brest, France, pp. 1-8 (2000).

Richardson et al., "Design of capacity approaching irregular low density parity check codes," IEEE Trans. Inform. Theory 47: 619-637 (Feb. 2001).

Richardson, T. and R. Urbanke, "Efficient encoding of low-density parity check codes," IEEE Trans. Inform. Theory 47: 638-656 (Feb. 2001).

Wilberg, et al., "Codes and Iteratie Decoding on General Graphs", 1995 Intl. Symposium on Information Theory, Sep. 1995, p. 468.

* cited by examiner

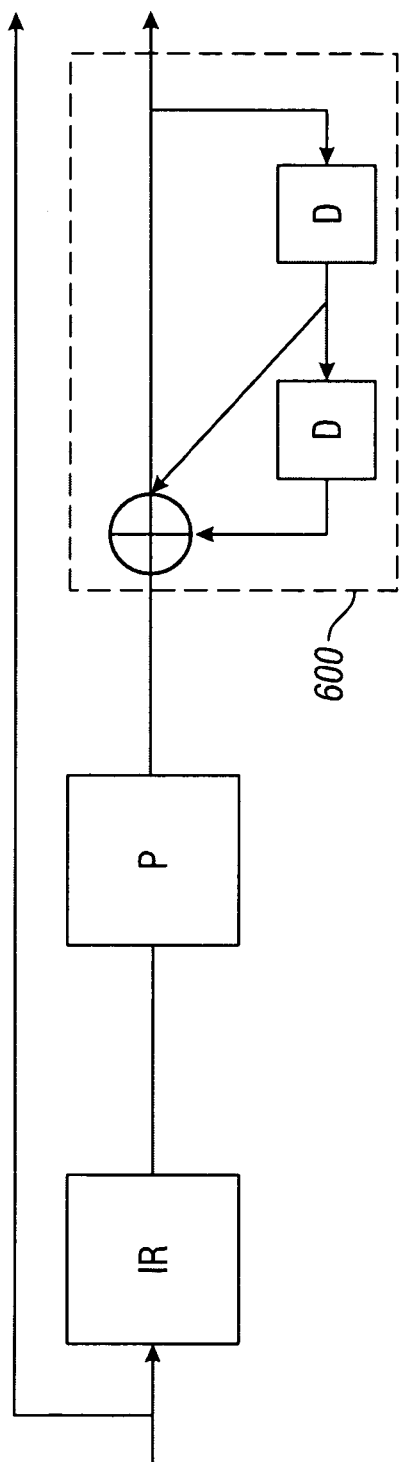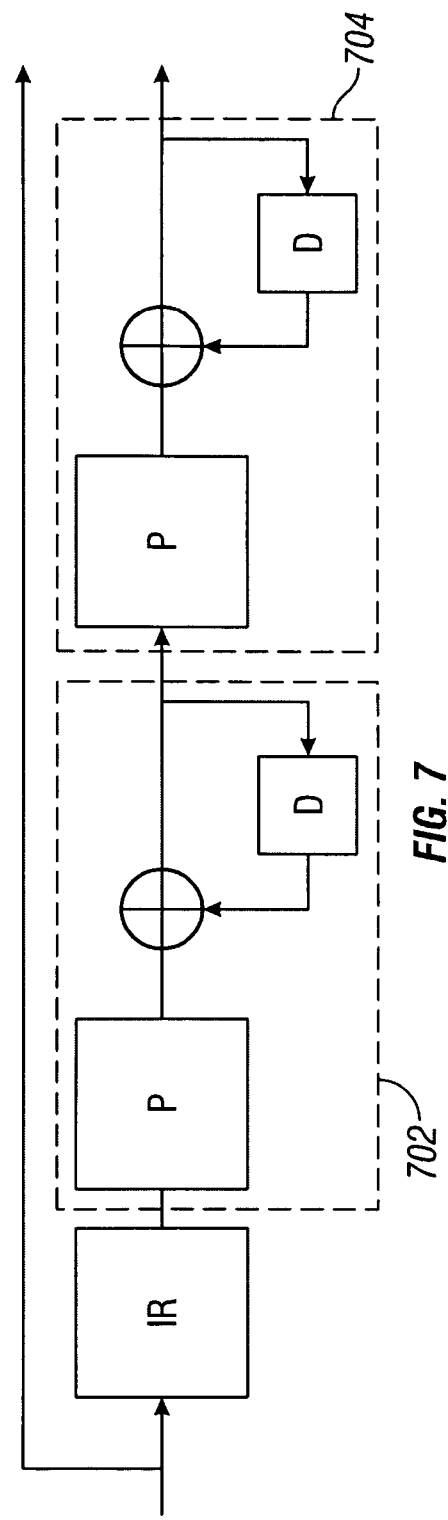

SERIAL CONCATENATION OF INTERLEAVED CONVOLUTIONAL CODES FORMING TURBO-LIKE CODES

CROSS-REFERENCE TO RELATED APPLICATIONS

This application is a continuation of U.S. application Ser. No. 09/861,102, filed May 18, 2001, now U.S. Pat. No. 7,116, 710, which claims the priority of U.S. provisional application Ser. No. 60/205,095, filed May 18, 2000, and is a continuation-in-part of U.S. application Ser. No. 09/922,852, filed Aug. 18, 2000, now U.S. Pat. No. 7,089,477.

GOVERNMENT LICENSE RIGHTS

The U.S. Government has a paid-up license in this invention and the right in limited circumstances to require the patent owner to license others on reasonable terms as provided for by the terms of Grant No. CCR-9804793 awarded by the National Science Foundation.

BACKGROUND

Properties of a channel affect the amount of data that can be handled by the channel. The so-called "Shannon limit" defines the theoretical limit of the amount of data that a channel can carry.

Different techniques have been used to increase the data rate that can be handled by a channel. "Near Shannon Limit Error-Correcting Coding and Decoding: Turbo Codes," by Berrou et al. ICC, pp 1064-1070, (1993), described a new "turbo code" technique that has revolutionized the field of error correcting codes. Turbo codes have sufficient randomness to allow reliable communication over the channel at a high data rate near capacity. However, they still retain sufficient structure to allow practical encoding and decoding algorithms. Still, the technique for encoding and decoding turbo codes can be relatively complex.

A standard turbo coder 100 is shown in FIG. 1. A block of k information bits is input directly to a first coder 102. A k bit interleaver 106 also receives the k bits and interleaves them prior to applying them to a second coder 104. The second coder produces an output that has more bits than its input, that is, it is a coder with rate that is less than 1. The coders 102, 104 are typically recursive convolutional coders.

Three different items are sent over the channel 150: the original k bits, first encoded bits 110, and second encoded bits 112. At the decoding end, two decoders are used: a first constituent decoder 160 and a second constituent decoder 162. Each receives both the original k bits, and one of the encoded portions 110, 112. Each decoder sends likelihood estimates of the decoded bits to the other decoders. The estimates are used to decode the uncoded information bits as corrupted by the noisy channel.

SUMMARY

A coding system according to an embodiment is configured to receive a portion of a signal to be encoded, for example, a data block including a fixed number of bits. The coding system includes an outer coder, which repeats and scrambles bits in the data block. The data block is apportioned into two or more sub-blocks, and bits in different sub-blocks are repeated a different number of times according to a selected degree profile. The outer coder may include a repeater with a variable rate and an interleaver. Alternatively, the outer coder may be a low-density generator matrix (LDGM) coder.

The repeated and scrambled bits are input to an inner coder that has a rate substantially close to one. The inner coder may include one or more accumulators that perform recursive modulo two addition operations on the input bit stream.

The encoded data output from the inner coder may be transmitted on a channel and decoded in linear time at a destination using iterative decoding techniques. The decoding techniques may be based on a Tanner graph representation of the code.

BRIEF DESCRIPTION OF THE DRAWINGS

FIG. 6 is a schematic diagram of a coder according to an alternate embodiment.

FIG. 7 is a schematic diagram of a coder according to another alternate embodiment.

DETAILED DESCRIPTION

Figure 1:
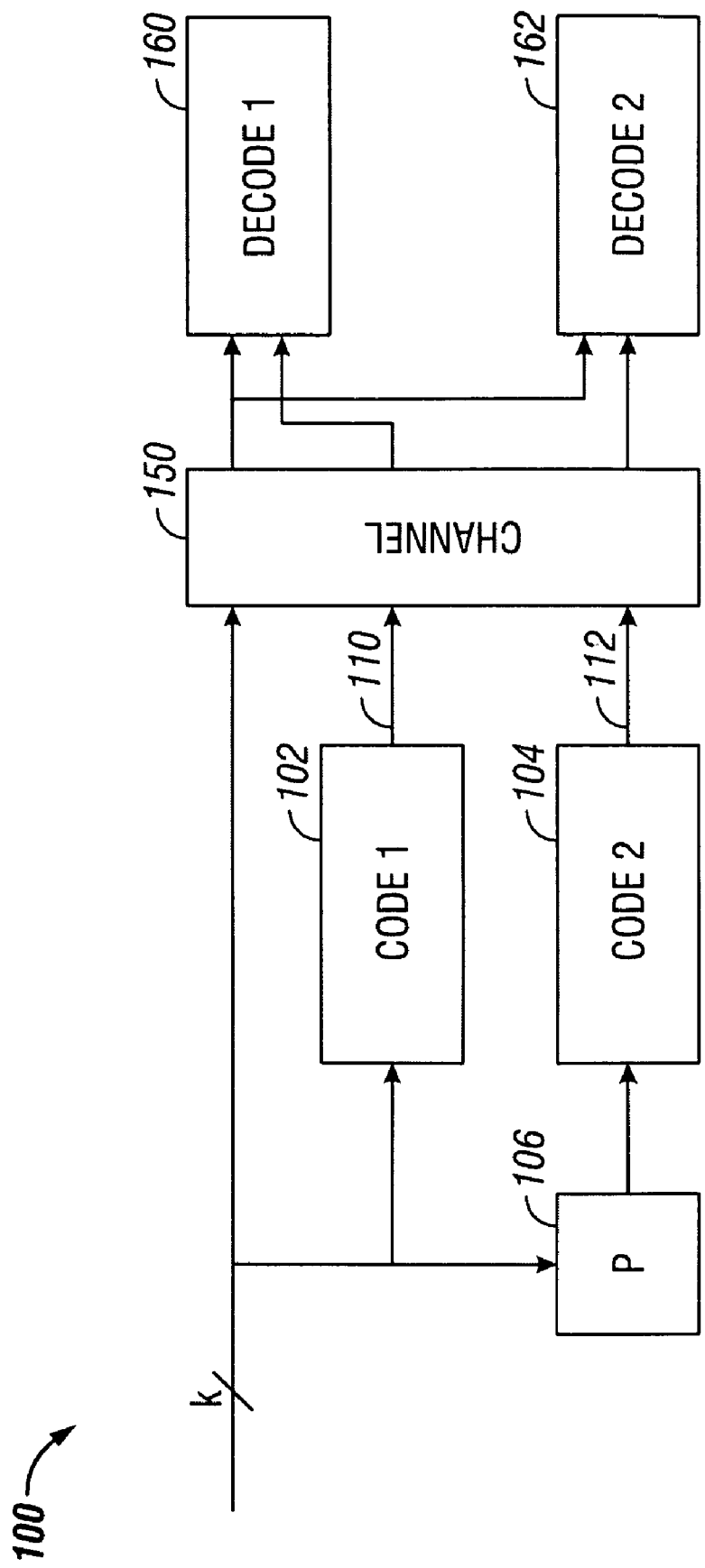
FIG. 1 is a schematic diagram of a prior "turbo code" system.
Figure 2:
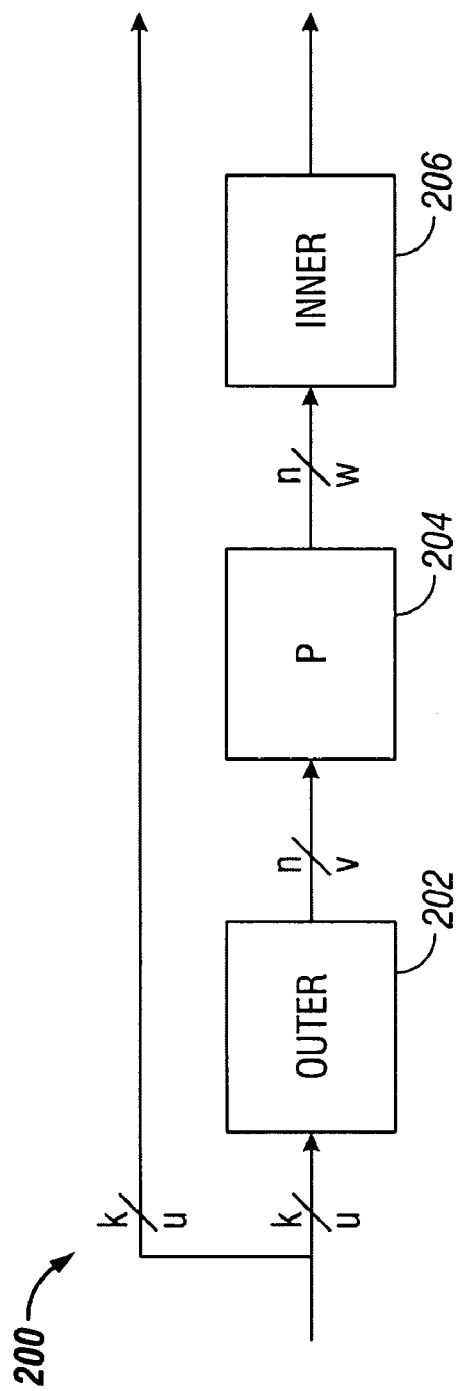
FIG. 2 is a schematic diagram of a coder according to an embodiment.

FIG. 2 illustrates a coder 200 according to an embodiment. The coder 200 may include an outer coder 202, an interleaver 204, and inner coder 206. The coder may be used to format blocks of data for transmission, introducing redundancy into the stream of data to protect the data from loss due to transmission errors. The encoded data may then be decoded at a destination in linear time at rates that may approach the channel capacity.

The outer coder 202 receives the uncoded data. The data may be partitioned into blocks of fixed size, say k bits. The outer coder may be an (n,k) binary linear block coder, where n>k. The coder accepts as input a block u of k data bits and produces an output block v of n data bits. The mathematical relationship between u and v is $v=T_0 u$, where $T_0$ is an n×k matrix, and the rate of the coder is k/n.

The rate of the coder may be irregular, that is, the value of $T_0$ is not constant, and may differ for sub-blocks of bits in the data block. In an embodiment, the outer coder 202 is a repeater that repeats the k bits in a block a number of times q to produce a block with n bits, where n=qk. Since the repeater has an irregular output, different bits in the block may be repeated a different number of times. For example, a fraction of the bits in the block may be repeated two times, a fraction of bits may be repeated three times, and the remainder of bits may be repeated four times. These fractions define a degree sequence, or degree profile, of the code.

The inner coder 206 may be a linear rate-1 coder, which means that the n-bit output block x can be written as $x=T_I w$, where $T_I$ is a nonsingular n×n matrix. The inner coder 210 can have a rate that is close to 1, e.g., within 50%, more preferably 10% and perhaps even more preferably within 1% of 1.

In an embodiment, the inner coder 206 is an accumulator, which produces outputs that are the modulo two (mod-2)

partial sums of its inputs. The accumulator may be a truncated rate-1 recursive convolutional coder with the transfer function 1/(1+D). Such an accumulator may be considered a block coder whose input block $[x_1, \ldots, x_n]$ and output block $[y_1, \ldots, y_n]$ are related by the formula $y_1 = x_1$ $y_2 = x_1 \oplus x_2$ $y_3 = x_1 \oplus x_2 \oplus x_3$

•

•

•

$y_n = x_1 \oplus x_2 \oplus x_3 \oplus \ldots \oplus x_n$.

where "$\oplus$" denotes mod-2, or exclusive-OR (XOR), addition. An advantage of this system is that only mod-2 addition is necessary for the accumulator. The accumulator may be embodied using only XOR gates, which may simplify the design.

The bits output from the outer coder 202 are scrambled before they are input to the inner coder 206. This scrambling may be performed by the interleaver 204, which performs a pseudo-random permutation of an input block v, yielding an output block w having the same length as v.

Figure 3:
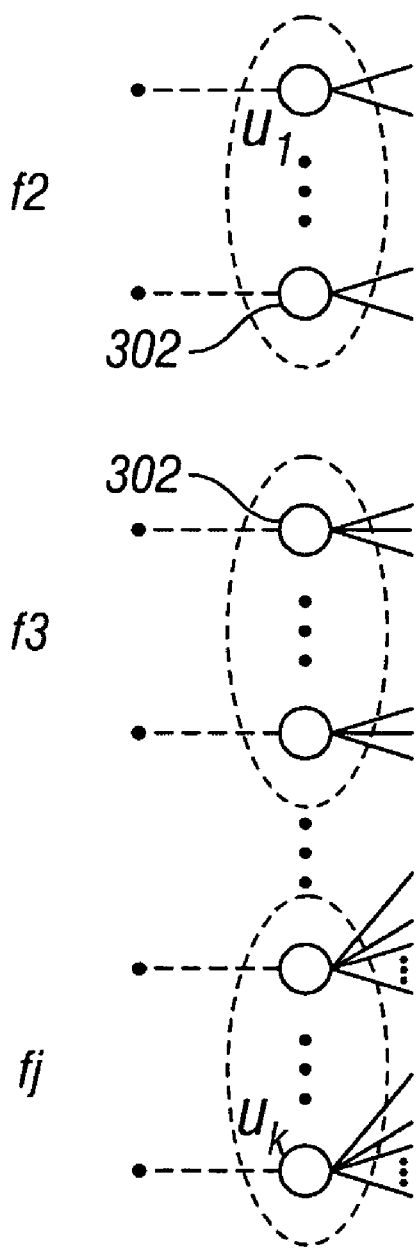
FIG. 3 is a Tanner graph for an irregular repeat and accumulate (IRA) coder.
Figure 3:
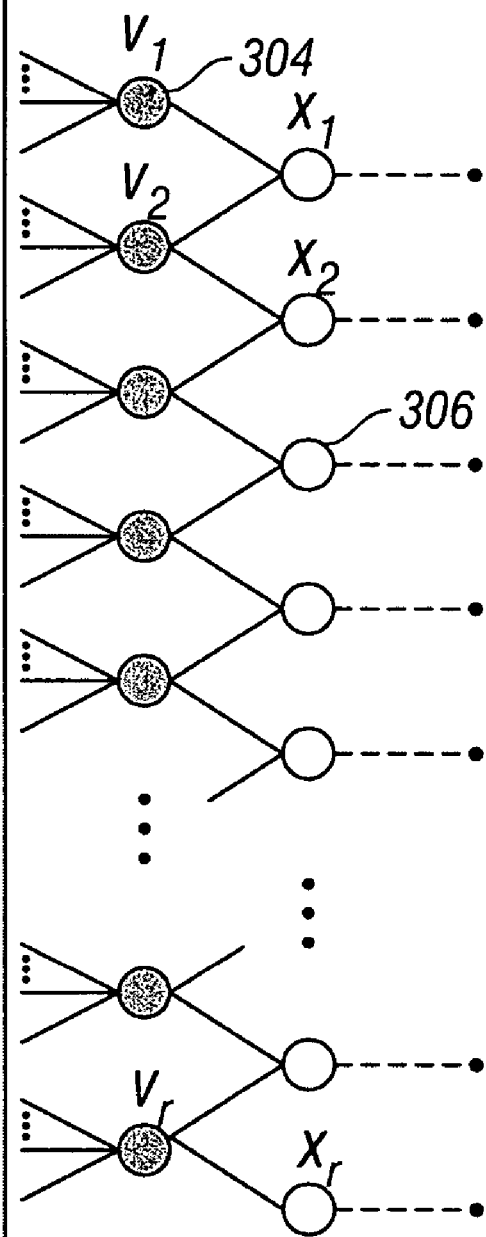

The serial concatenation of the interleaved irregular repeat code and the accumulate code produces an irregular repeat and accumulate (IRA) code. An IRA code is a linear code, and as such, may be represented as a set of parity checks. The set of parity checks may be represented in a bipartite graph, called the Tanner graph, of the code. FIG. 3 shows a Tanner graph 300 of an IRA code with parameters $(f_1, \ldots, f_j; a)$, where $f_i \geq 0$, $\Sigma_i f_i = 1$ and "a" is a positive integer. The Tanner graph includes two kinds of nodes: variable nodes (open circles) and check nodes (filled circles). There are k variable nodes 302 on the left, called information nodes. There are r variable nodes 306 on the right, called parity nodes. There are $r = (k \Sigma_i i f_i)/a$ check nodes 304 connected between the information nodes and the parity nodes. Each information node 302 is connected to a number of check nodes 304. The fraction of information nodes connected to exactly i check nodes is $f_i$. For example, in the Tanner graph 300, each of the $f_2$ information nodes are connected to two check nodes, corresponding to a repeat of q=2, and each of the $f_3$ information nodes are connected to three check nodes, corresponding to q=3.

Each check node 304 is connected to exactly "a" information nodes 302. In FIG. 3, a=3. These connections can be made in many ways, as indicated by the arbitrary permutation of the ra edges joining information nodes 302 and check nodes 304 in permutation block 310. These connections correspond to the scrambling performed by the interleaver 204.

Figure 4:
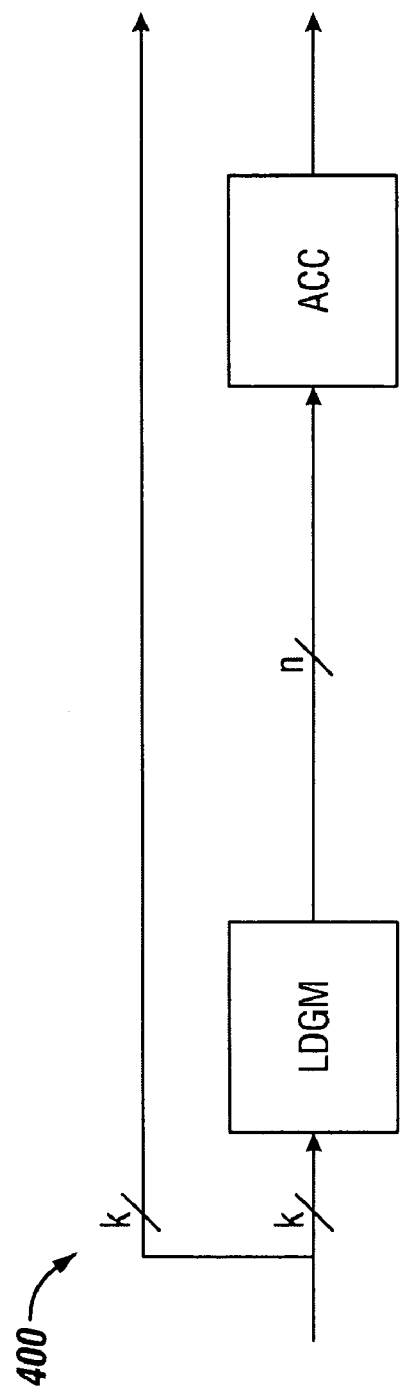
FIG. 4 is a schematic diagram of an IRA coder according to an embodiment.

In an alternate embodiment, the outer coder 202 may be a low-density generator matrix (LDGM) coder that performs an irregular repeat of the k bits in the block, as shown in FIG. 4. As the name implies, an LDGM code has a sparse (low-density) generator matrix. The IRA code produced by the coder 400 is a serial concatenation of the LDGM code and the accumulator code. The interleaver 204 in FIG. 2 may be excluded due to the randomness already present in the structure of the LDGM code.

If the permutation performed in permutation block 310 is fixed, the Tanner graph represents a binary linear block code with k information bits $(u_1, \ldots, u_k)$ and r parity bits $(x_1, \ldots, x_r)$, as follows. Each of the information bits is associated with one of the information nodes 302, and each of the parity bits is associated with one of the parity nodes 306. The value of a parity bit is determined uniquely by the condition that the mod-2 sum of the values of the variable nodes connected to each of the check nodes 304 is zero. To see this, set $x_0 = 0$. Then if the values of the bits on the ra edges coming out the permutation box are $(v_1, \ldots, v_{ra})$, then we have the recursive formula $$x_j = x_{j-1} + \sum_{i=1}^{\lambda} v_{(j-1)\lambda + i}$$

for j=1, 2, . . . , r. This is in effect the encoding algorithm.

Two types of IRA codes are represented in FIG. 3, a nonsystematic version and a systematic version. The nonsystematic version is an (r,k) code, in which the codeword corresponding to the information bits $(u_1, \ldots, u_k)$ is $(x_1, \ldots, x_r)$. The systematic version is a (k+r, k) code, in which the codeword is $(u_1, \ldots, u_k; x_1, \ldots, x_r)$.

The rate of the nonsystematic code is $$R_{nsys} = \frac{a}{\sum_i i f_i}$$

The rate of the systematic code is $$R_{sys} = \frac{a}{a + \sum_i i f_i}$$

For example, regular repeat and accumulate (RA) codes can be considered nonsystematic IRA codes with a=1 and exactly one $f_i$ equal to 1, say $f_q=1$, and the rest zero, in which case $R_{nsys}$ simplifies to R=1/q.

The IRA code may be represented using an alternate notation. Let $\lambda_i$ be the fraction of edges between the information nodes 302 and the check nodes 304 that are adjacent to an information node of degree i, and let $\rho_i$ be the fraction of such edges that are adjacent to a check node of degree i+2 (i.e., one that is adjacent to i information nodes). These edge fractions may be used to represent the IRA code rather than the corresponding node fractions. Define $\lambda(x) = \Sigma_i \lambda_i x^{i-1}$ and $\rho(x) = \Sigma_i \rho_i x^{i-1}$ to be the generating functions of these sequences. The pair $(\lambda, \rho)$ is called a degree distribution. For $L(x) = \Sigma_i f_i x^i$, $$f_i = \frac{\lambda_i / i}{\sum_j \lambda_j / j}$$

$$L(x) = \int_0^x \lambda(t)\,dt \Big/ \int_0^1 \lambda(t)\,dt$$

The rate of the systematic IRA code given by the degree distribution is given by $$\text{Rate} = \left(1 + \frac{\sum_j \rho_j/j}{\sum_j \lambda_j/j}\right)^{-1}$$

Figure 5A:
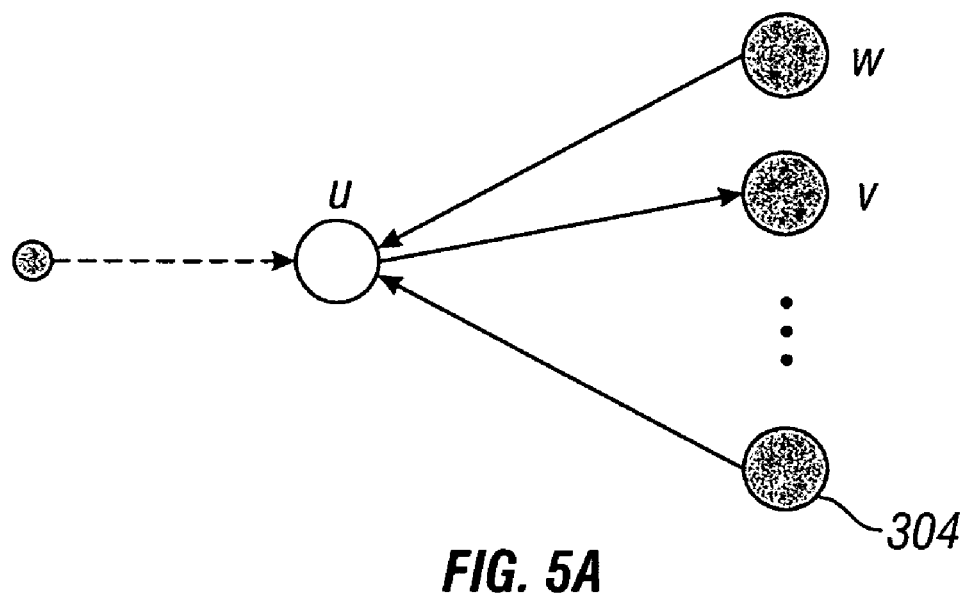
FIG. 5A illustrates a message from a variable node to a check node on the Tanner graph of FIG. 3.
Figure 5B:
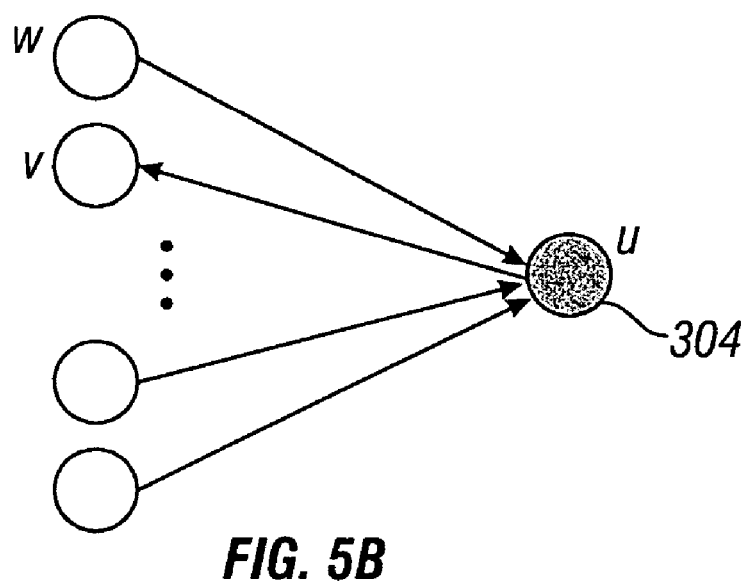
FIG. 5B illustrates a message from a check node to a variable node on the Tanner graph of FIG. 3.

"Belief propagation" on the Tanner Graph realization may be used to decode IRA codes. Roughly speaking, the belief propagation decoding technique allows the messages passed on an edge to represent posterior densities on the bit associated with the variable node. A probability density on a bit is a pair of non-negative real numbers p(0), p(1) satisfying p(0)+ p(1)=1, where p(0) denotes the probability of the bit being 0, p(1) the probability of it being 1. Such a pair can be represented by its log likelihood ratio, m=log(p(0)/p(1)). The outgoing message from a variable node u to a check node v represents information about u, and a message from a check node u to a variable node v represents information about u, as shown in FIGS. 5A and 5B, respectively.

The outgoing message from a node u to a node v depends on the incoming messages from all neighbors w of u except v. If u is a variable message node, this outgoing message is $$m(u \rightarrow v) = \sum_{w \neq v} m(w \rightarrow u) + m_0(u)$$

where $m_0(u)$ is the log-likelihood message associated with u. If u is a check node, the corresponding formula is $$\tanh \frac{m(u \rightarrow v)}{2} = \prod_{w \neq v} \tanh \frac{m(w \rightarrow u)}{2}$$

Before decoding, the messages m(w→u) and m(u→v) are initialized to be zero, and $m_0(u)$ is initialized to be the log-likelihood ratio based on the channel received information. If the channel is memoryless, i.e., each channel output only relies on its input, and y is the output of the channel code bit u, then $m_0(u)$=log(p(u=0|y)/p(u=1|y)). After this initialization, the decoding process may run in a fully parallel and local manner. In each iteration, every variable/check node receives messages from its neighbors, and sends back updated messages. Decoding is terminated after a fixed number of iterations or detecting that all the constraints are satisfied. Upon termination, the decoder outputs a decoded sequence based on the messages m(u)=$\Sigma w_m$(w→u).

Thus, on various channels, iterative decoding only differs in the initial messages $m_0(u)$. For example, consider three memoryless channel models: a binary erasure channel (BEC); a binary symmetric channel (BSC); and an additive white Gaussian noise (AGWN) channel.

In the BEC, there are two inputs and three outputs. When 0 is transmitted, the receiver can receive either 0 or an erasure E. An erasure E output means that the receiver does not know how to demodulate the output. Similarly, when 1 is transmitted, the receiver can receive either 1 or E. Thus, for the BEC, y ∈ {0, E, 1}, and $$m_0(u) = \begin{cases} +\infty & \text{if } y = 0 \\ 0 & \text{if } y = E \\ -\infty & \text{if } y = 1 \end{cases}$$

In the BSC, there are two possible inputs (0,1) and two possible outputs (0, 1). The BSC is characterized by a set of conditional probabilities relating all possible outputs to possible inputs. Thus, for the BSC y ∈ {0, 1}, $$m_0(u) = \begin{cases} \log\frac{1-p}{p} & \text{if } y = 0 \\ -\log\frac{1-p}{p} & \text{if } y = 1 \end{cases}$$

and

In the AWGN, the discrete-time input symbols X take their values in a finite alphabet while channel output symbols Y can take any values along the real line. There is assumed to be no distortion or other effects other than the addition of white Gaussian noise. In an AWGN with a Binary Phase Shift Keying (BPSK) signaling which maps 0 to the symbol with amplitude $\sqrt{E_s}$ and 1 to the symbol with amplitude $-\sqrt{E_s}$, output y ∈ R, then $$m_0(u) = 4y\sqrt{E_s}/N_0$$

where $N_0/2$ is the noise power spectral density.

The selection of a degree profile for use in a particular transmission channel is a design parameter, which may be affected by various attributes of the channel. The criteria for selecting a particular degree profile may include, for example, the type of channel and the data rate on the channel. For example, Table 1 shows degree profiles that have been found to produce good results for an AWGN channel model.

TABLE 1

| a | 2 | 3 | 4 |
|---|---|---|---|
| λ2 | 0.139025 | 0.078194 | 0.054485 |
| λ3 | 0.2221555 | 0.128085 | 0.104315 |
| λ5 |  | 0.160813 |  |
| λ6 | 0.638820 | 0.036178 | 0.126755 |
| λ10 |  |  | 0.229816 |
| λ11 |  |  | 0.016484 |
| λ12 |  | 0.108828 |  |
| λ13 |  | 0.487902 |  |
| λ14 |  |  |  |
| λ16 |  |  |  |
| λ27 |  |  | 0.450302 |
| λ28 |  |  | 0.017842 |
| Rate | 0.333364 | 0.333223 | 0.333218 |
| σGA | 1.1840 | 1.2415 | 1.2615 |
| σ* | 1.1981 | 1.2607 | 1.2780 |
| (Eb/N0) * (dB) | 0.190 | −0.250 | −0.371 |
| S.L. (dB) | −0.4953 | −0.4958 | −0.4958 |

Table 1 shows degree profiles yielding codes of rate approximately ⅓ for the AWGN channel and with a=2, 3, 4. For each sequence, the Gaussian approximation noise threshold, the actual sum-product decoding threshold and the corresponding energy per bit ($E_b$)-noise power ($N_0$) ratio in dB are given. Also listed is the Shannon limit (S.L.).

As the parameter "a" is increased, the performance improves. For example, for a=4, the best code found has an iterative decoding threshold of $E_b/N_0$=−0.371 dB, which is only 0.12 dB above the Shannon limit.

The accumulator component of the coder may be replaced by a "double accumulator" 600 as shown in FIG. 6. The double accumulator can be viewed as a truncated rate 1 convolutional coder with transfer function $1/(1+D+D^2)$.

Alternatively, a pair of accumulators may be the added, as shown in FIG. 7. There are three component codes: the "outer" code 700, the "middle" code 702, and the "inner" code 704. The outer code is an irregular repetition code, and the middle and inner codes are both accumulators.

IRA codes may be implemented in a variety of channels, including memoryless channels, such as the BEC, BSC, and AWGN, as well as channels having non-binary input, non-symmetric and fading channels, and/or channels with memory.

A number of embodiments have been described. Nevertheless, it will be understood that various modifications may be made without departing from the spirit and scope of the invention. Accordingly, other embodiments are within the scope of the following claims.

The invention claimed is:

1. A method comprising:
   receiving a collection of message bits having a first sequence in a source data stream;
   generating a sequence of parity bits, wherein each parity bit "$x_j$" in the sequence is in accordance with the formula $$x_j = x_{j-1} + \sum_{i=1}^{\lambda} v_{(j-1)\lambda+i},$$

where

"$x_{j-1}$" is the value of a parity bit "j−1," and $$\text{"}\sum_{i=1}^{a} v_{(j-1)a+1}\text{"}$$

is the value of a sum of "a" randomly chosen irregular repeats of the message bits; and making the sequence of parity bits available for transmission in a transmission data stream.

2. The method of claim 1, wherein the sequence of parity bits is generated is in accordance with "a" being constant.

3. The method of claim 1, wherein the sequence of parity bits is generated is in accordance with "a" varying for different parity bits.

4. The method of claim 1, wherein generating the sequence of parity bits comprises performing recursive modulo two addition operations on the random sequence of bits.

5. The method of claim 1, wherein generating the sequence of parity bits comprises:
   generating a random sequence of bits that repeats each of the message bits one or more times with the repeats of the message bits being distributed in a random sequence, wherein different fractions of the message bits are each repeated a different number of times and the number of repeats for each message bit is irregular; and
   XOR summing in linear sequential fashion a predecessor parity bit and "a" bits of the random sequence of bits.

6. The method of claim 5, wherein generating the random sequence of bits comprises coding the collection of message bits using a low-density generator matrix (LDGM) coder.

7. The method of claim 5, wherein generating the random sequence of bits comprises:
   producing a block of data bits, wherein different message bits are each repeated a different number of times in a sequence that matches the first sequence; and
   randomly permuting the different bits to generate the random sequence.

8. The method of claim 1, further comprising transmitting the sequence of parity bits.

9. The method of claim 8, wherein transmitting the sequence of parity bits comprises transmitting the sequence of parity bits as part of a nonsystematic code.

10. The method of claim 8, wherein transmitting the sequence of parity bits comprises transmitting the sequence of parity bits as part of a systematic code.

11. A device comprising:
   an encoder configured to receive a collection of message bits and encode the message bits to generate a collection of parity bits in accordance with the following Tanner graph:

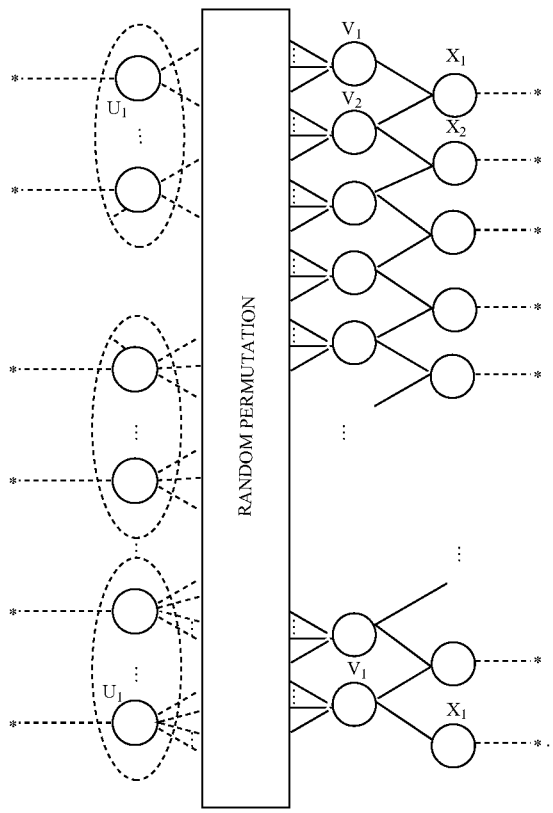

12. The device of claim 11, wherein the encoder is configured to generate the collection of parity bits as if a number of inputs into nodes $v_i$ was not constant.

13. The device of claim 11, wherein the encoder comprises:
a low-density generator matrix (LDGM) coder configured to perform an irregular repeat on message bits having a first sequence in a source data stream to output a random sequence of repeats of the message bits; and
an accumulator configured to XOR sum in linear sequential fashion a predecessor parity bit and "a" bits of the random sequence of repeats of the message bits.

14. The device of claim 12, wherein the accumulator comprises a recursive convolutional coder.

15. The device of claim 14, wherein the recursive convolutional coder comprises a truncated rate-1 recursive convolutional coder.

16. The device of claim 14, wherein the recursive convolutional coder has a transfer function of $1/(1+D)$.

17. The device of claim 12, further comprising a second accumulator configured to determine a second sequence of parity bits that defines a second condition that constrains the random sequence of repeats of the message bits.

18. A device comprising:
a message passing decoder configured to decode a received data stream that includes a collection of parity bits, the message passing decoder comprising two or more check/variable nodes operating in parallel to receive messages from neighboring check/variable nodes and send updated messages to the neighboring variable/check nodes, wherein the message passing decoder is configured to decode the received data stream that has been encoded in accordance with the following Tanner graph:

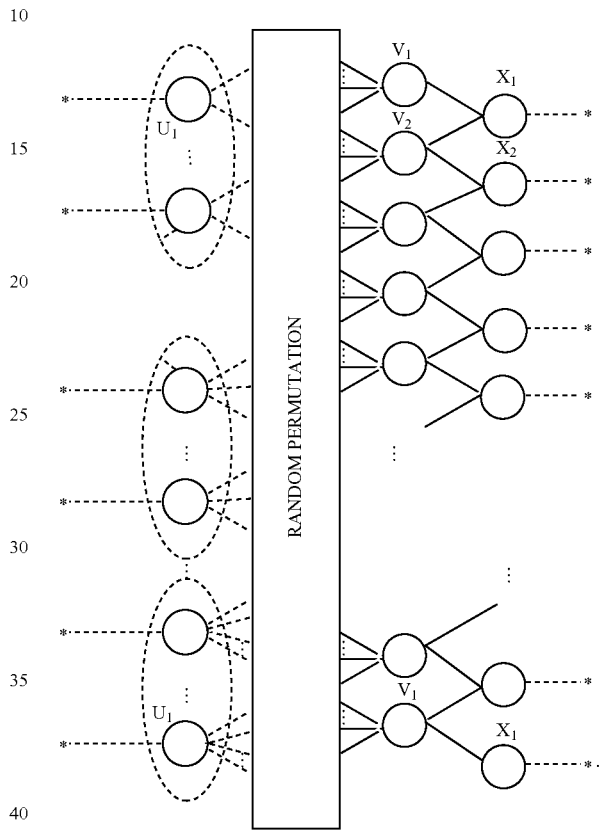

19. The device of claim 18, wherein the message passing decoder is configured to decode the received data stream that includes the message bits.

20. The device of claim 18, wherein the message passing decoder is configured to decode the received data stream as if a number of inputs into nodes $v_i$ was not constant.

21. The device of claim 18, wherein the message passing decoder is configured to decode in linear time at rates that approach a capacity of a channel.

22. The device of claim 18, wherein the message passing decoder comprises a belief propagation decoder.

23. The device of claim 18, wherein the message passing decoder is configured to decode the received data stream without the message bits.

* * * * *

UNITED STATES PATENT AND TRADEMARK OFFICE
CERTIFICATE OF CORRECTION

PATENT NO. : 7,421,032 B2
APPLICATION NO. : 11/542950
DATED : September 2, 2008
INVENTOR(S) : Hui Jin, Aamod Khandekar and Robert J. McEliece It is certified that error appears in the above-identified patent and that said Letters Patent is hereby corrected as shown below:

Title Page, item [73] (Assignee), line 1, please delete "Callifornia" and insert --California--, therefor.

Claim 11, Column 9, line 28, delete "$V_1$" and insert --$V_r$--, therefor.

Claim 11, Column 9, line 29, delete "$U_1$" and insert --$U_k$--, therefor.

Claim 11, Column 9, line 29, delete "$X_1$" and insert --$X_r$--, therefor.

Claim 18, Column 10, line 35, delete "$V_1$" and insert --$V_r$--, therefor.

Claim 18, Column 10, line 36, delete "$U_1$" and insert --$U_k$--, therefor.

Claim 18, Column 10, line 37, delete "$X_1$" and insert --$X_r$--, therefor.

Signed and Sealed this

Seventeenth Day of February, 2009

JOHN DOLL
*Acting Director of the United States Patent and Trademark Office*

UNITED STATES PATENT AND TRADEMARK OFFICE
CERTIFICATE OF CORRECTION

PATENT NO. : 7,421,032 B2
APPLICATION NO. : 11/542950
DATED : September 2, 2008
INVENTOR(S) : Hui Jin, Aamod Khandekar and Robert J. McEliece It is certified that error appears in the above-identified patent and that said Letters Patent is hereby corrected as shown below:

At column 4, line 14, please delete " $x_j = x_{j-1} + \sum_{i=1}^{\lambda} v_{(j-1)\lambda+i}$ " and insert -- $x_j = x_{j-1} + \sum_{i=1}^{a} v_{(j-1)a+i}$ --.

In claim 1, column 8, line 4, please delete " $x_j = x_{j-1} + \sum_{i=1}^{\lambda} v_{(j-1)\lambda+i}$ , " and insert -- $x_j = x_{j-1} + \sum_{i=1}^{a} v_{(j-1)a+i}$ , --.

In claim 1, column 8, line 13, please delete " $\sum_{i=1}^{a} v_{(j-1)a+1}$ " and insert -- $\sum_{i=1}^{a} v_{(j-1)a+i}$ --.

Signed and Sealed this

Twenty-seventh Day of July, 2010

David J. Kappos
*Director of the United States Patent and Trademark Office*